(12) United States Patent
Jung

(10) Patent No.: US 12,262,465 B2
(45) Date of Patent: Mar. 25, 2025

(54) CIRCUIT BOARD

(71) Applicant: LG INNOTEK CO., LTD., Seoul (KR)

(72) Inventor: Won Suk Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 130 days.

(21) Appl. No.: 17/925,059

(22) PCT Filed: May 13, 2021

(86) PCT No.: PCT/KR2021/005995
§ 371 (c)(1),
(2) Date: Nov. 14, 2022

(87) PCT Pub. No.: WO2021/230671
PCT Pub. Date: Nov. 18, 2021

(65) Prior Publication Data
US 2023/0189431 A1 Jun. 15, 2023

(30) Foreign Application Priority Data

May 13, 2020 (KR) .................. 10-2020-0057182

(51) Int. Cl.
*H05K 1/00* (2006.01)
*H05K 1/02* (2006.01)
*H05K 1/11* (2006.01)

(52) U.S. Cl.
CPC .......... *H05K 1/0225* (2013.01); *H05K 1/116* (2013.01); *H05K 2201/09509* (2013.01); *H05K 2201/096* (2013.01); *H05K 2201/09827* (2013.01)

(58) Field of Classification Search
CPC ............... H05K 1/116; H05K 1/0298; H05K 2201/09827; H05K 2201/09854
See application file for complete search history.

(56) References Cited

U.S. PATENT DOCUMENTS 7,937,833 B2   5/2011  Jung et al.
11,026,327 B2  6/2021  Shin
(Continued)

FOREIGN PATENT DOCUMENTS

CN   101175378   9/2010
JP   2006-165242  6/2006
(Continued)

OTHER PUBLICATIONS

JP 2022148980 A; English Translation (Year: 2020).*
(Continued)

*Primary Examiner* — Pete T Lee
(74) *Attorney, Agent, or Firm* — KED & Associates LLP

(57) ABSTRACT

A circuit board according to an embodiment includes an insulating layer; a second outer circuit pattern disposed on an upper surface of the insulating layer; and a via disposed in the insulating layer and connected to the second outer circuit pattern; wherein the second outer circuit pattern includes: a first pattern embedded in the insulating layer and having a first width; and a second pattern protruding on the upper surface of the insulating layer, having a second width greater than the first width, and connected to the first pattern through the via.

20 Claims, 10 Drawing Sheets

(56) References Cited

U.S. PATENT DOCUMENTS

| | | |
|---|---|---|
| 2008/0098597 A1 | 5/2008 | Jung et al. |
| 2012/0186866 A1* | 7/2012 | Mikado ............... H05K 3/4602 |
| | | 29/832 |
| 2013/0284506 A1* | 10/2013 | Zanma .................. H05K 1/185 |
| | | 29/832 |
| 2014/0041923 A1* | 2/2014 | Hisada .................. H05K 1/115 |
| | | 174/266 |
| 2016/0353568 A1 | 12/2016 | Lee et al. |
| 2018/0286794 A1 | 10/2018 | Chou et al. |
| 2020/0205284 A1 | 6/2020 | Shin |

FOREIGN PATENT DOCUMENTS

| | | |
|---|---|---|
| KR | 10-2016-0084666 | 7/2016 |
| KR | 10-2016-0140184 | 12/2016 |
| KR | 10-2017-0113819 | 10/2017 |
| KR | 10-1807620 | 12/2017 |
| KR | 10-2019-0012873 | 2/2019 |

OTHER PUBLICATIONS

International Search Report dated Aug. 30, 2021 issued in Application No. PCT/KR2021/005995.
Extended European Search Report dated Oct. 16, 2024 issued in Application No. 21803668.9.
Korean Office Action dated Jan. 6, 2025 issued in Application No. 10-2020-0057182.

\* cited by examiner

【FIG. 1A】
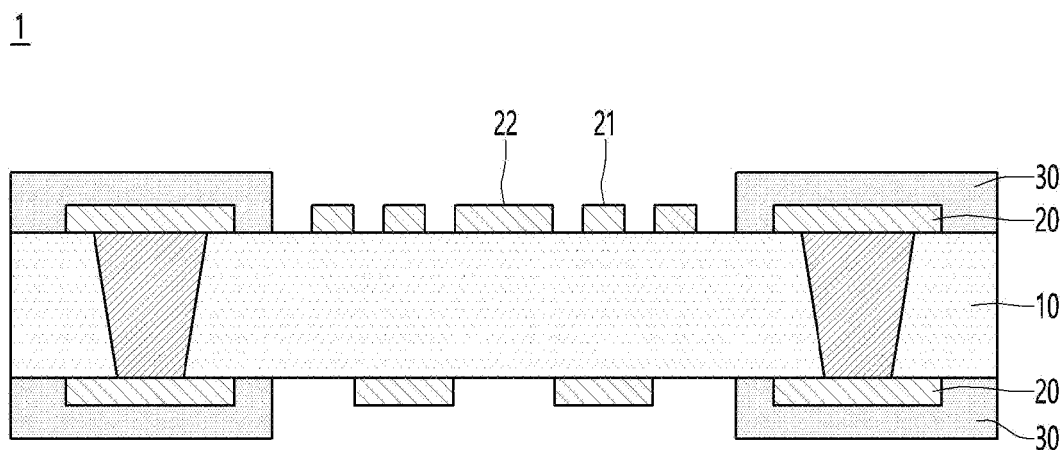
【FIG. 1B】
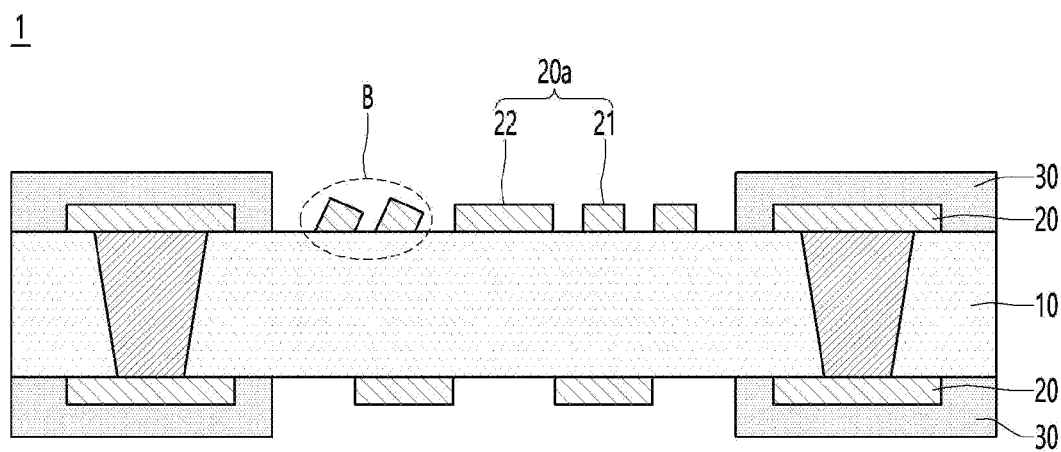

[FIG. 2]
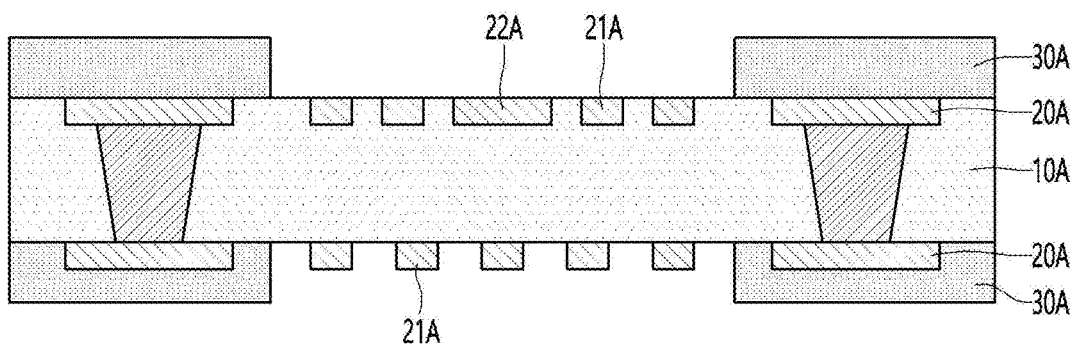
[FIG. 3]
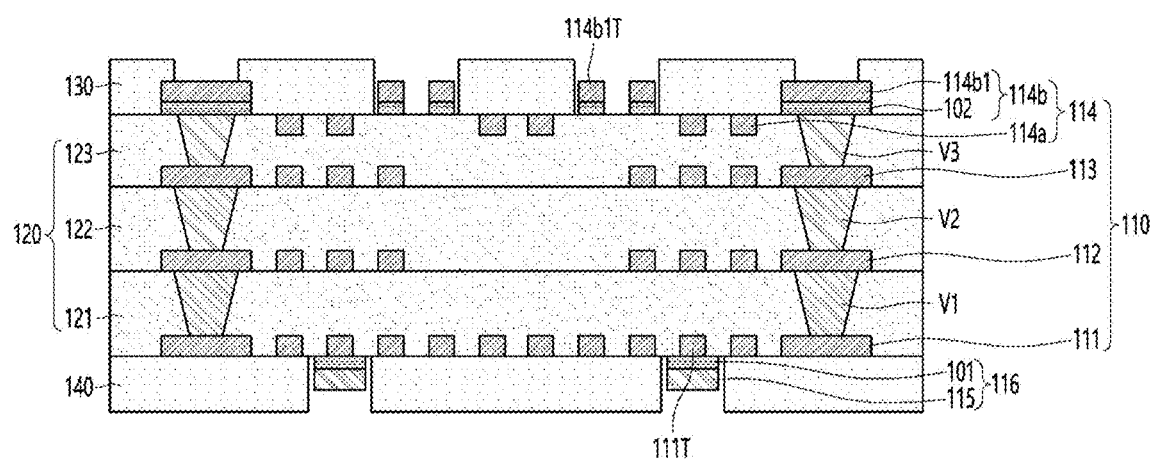
[FIG. 4]
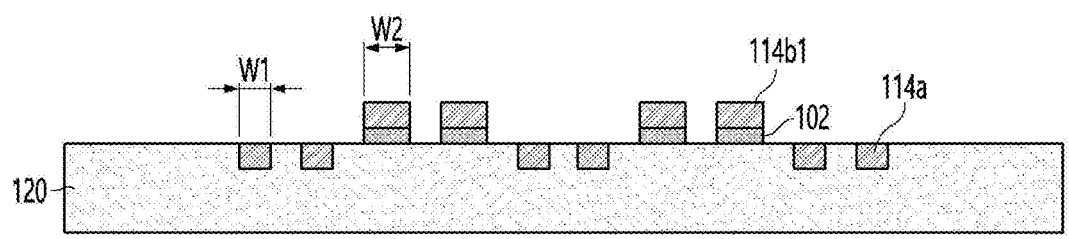

【FIG. 5】
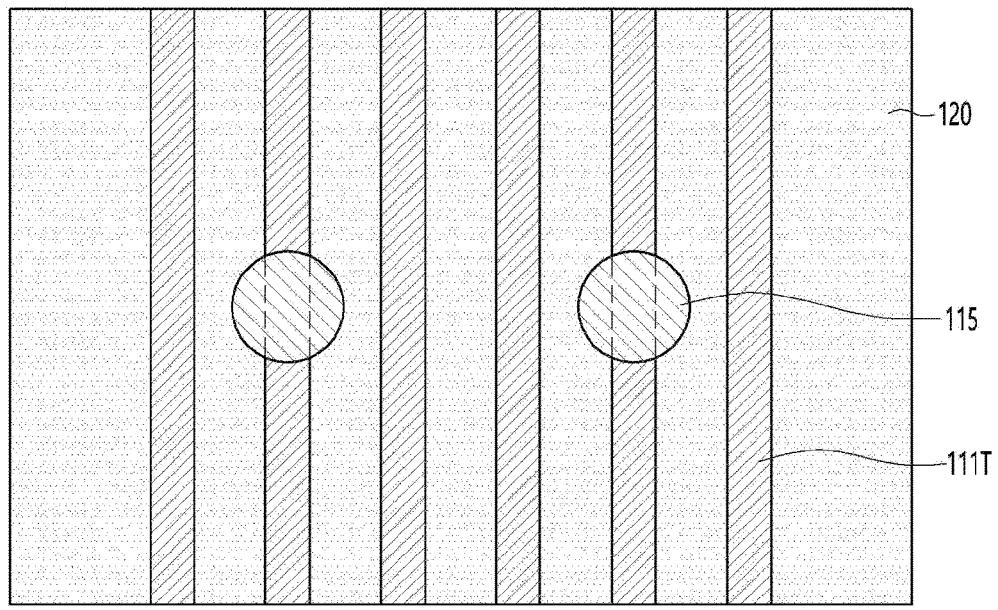
【FIG. 6】
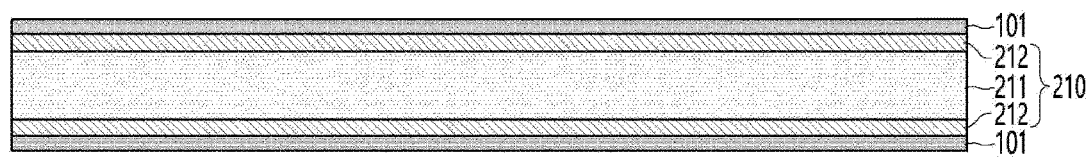
【FIG. 7】
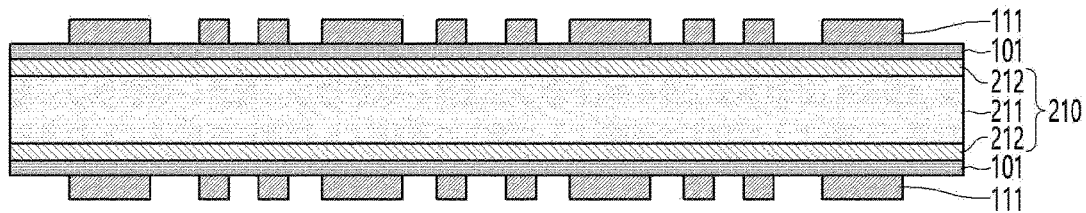

[FIG. 8]
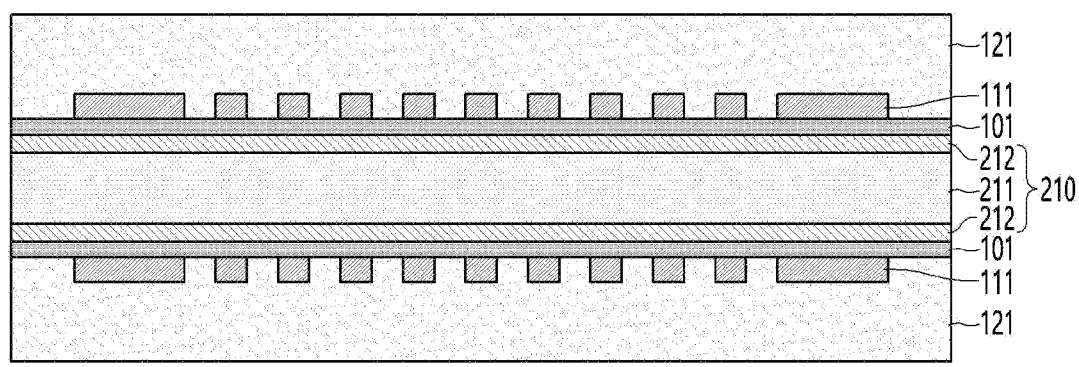
[FIG. 9]
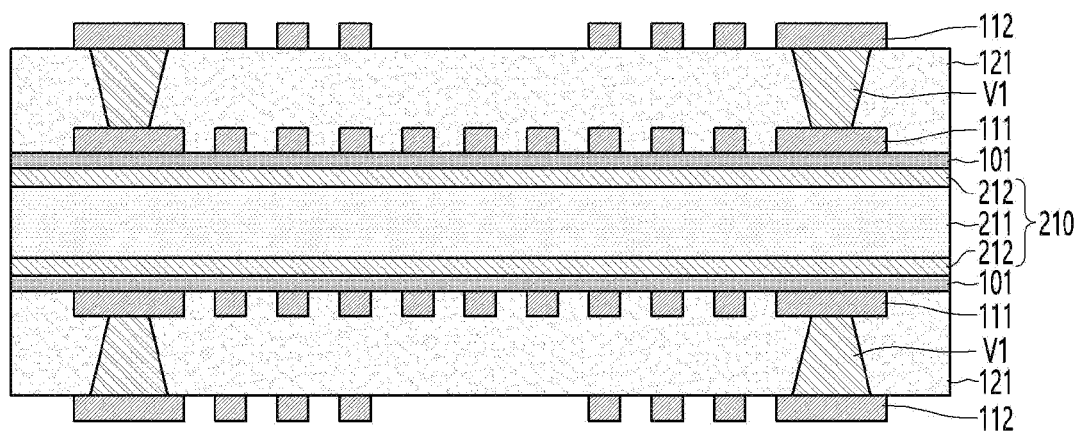

[FIG. 10]
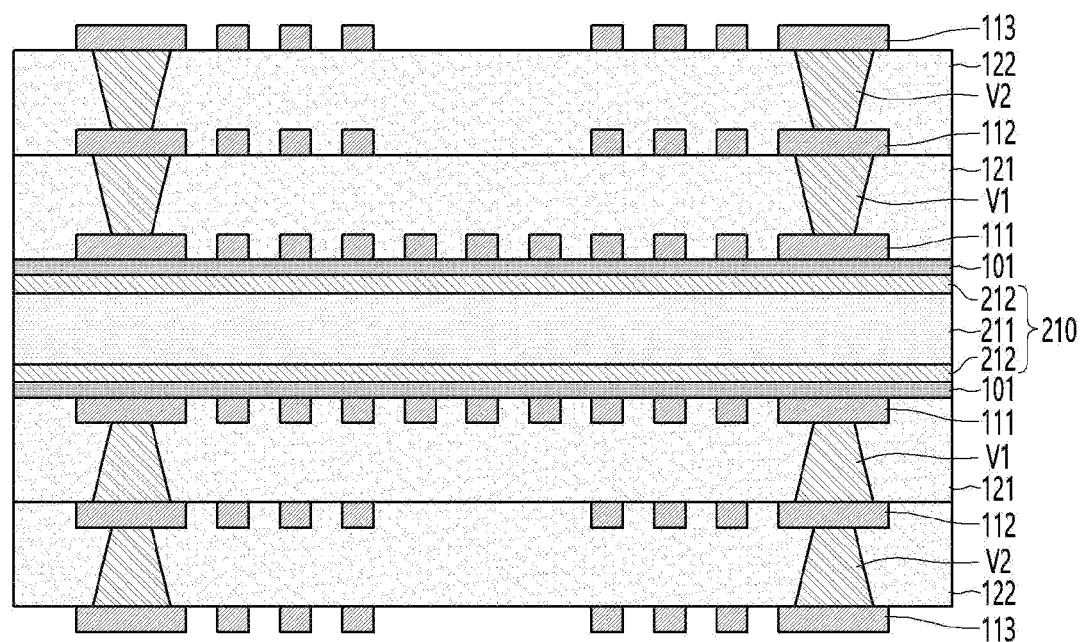

【FIG. 11】
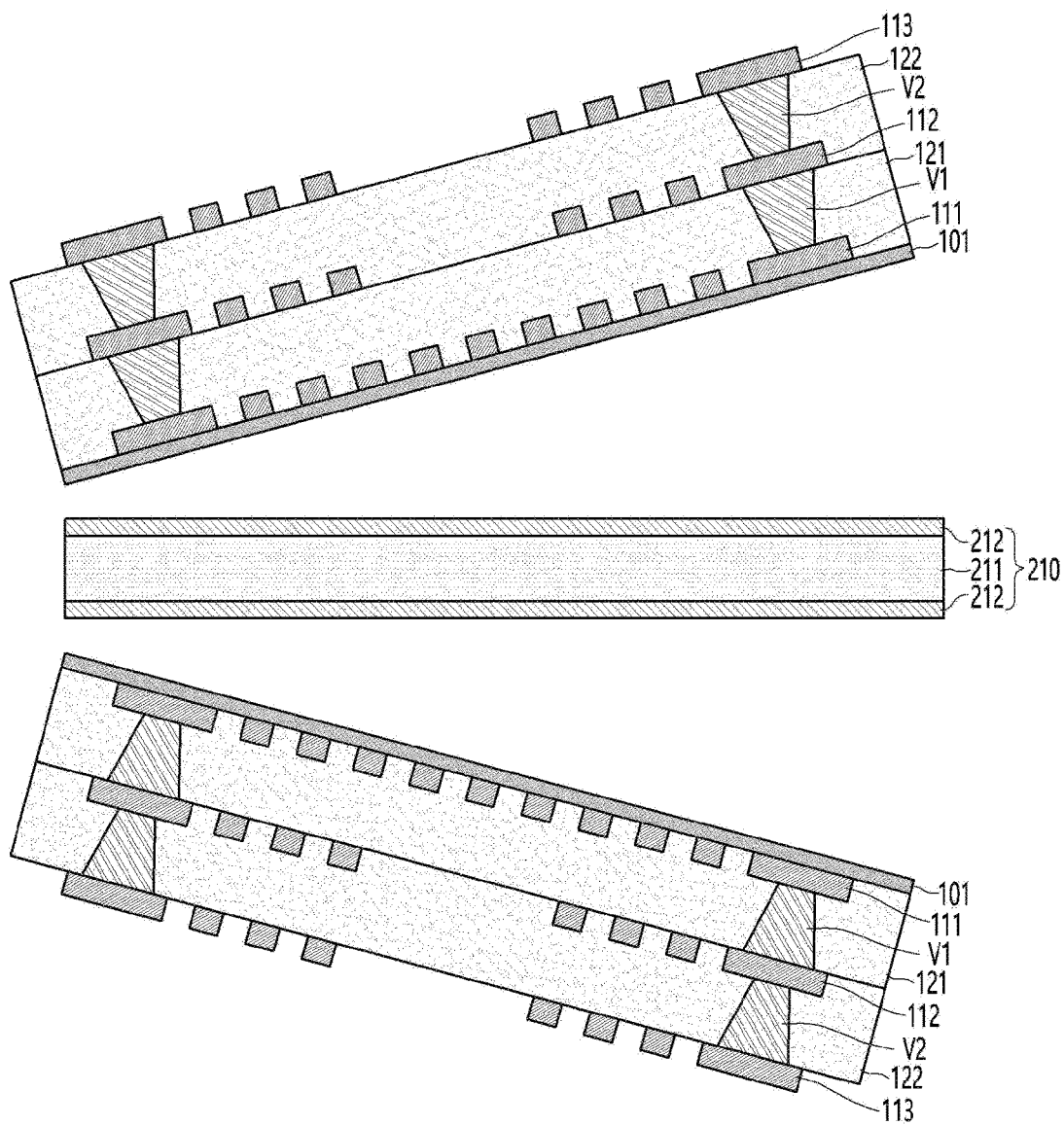
【FIG. 12】
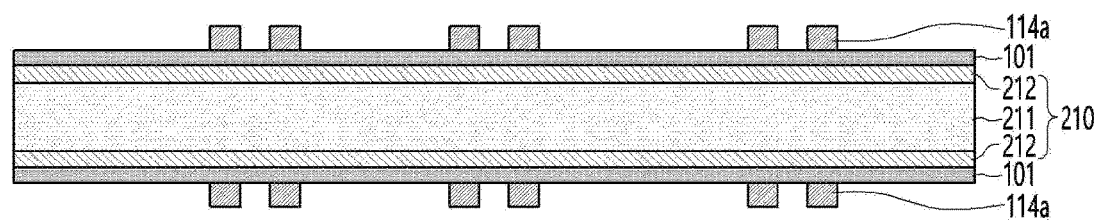

[FIG. 13]
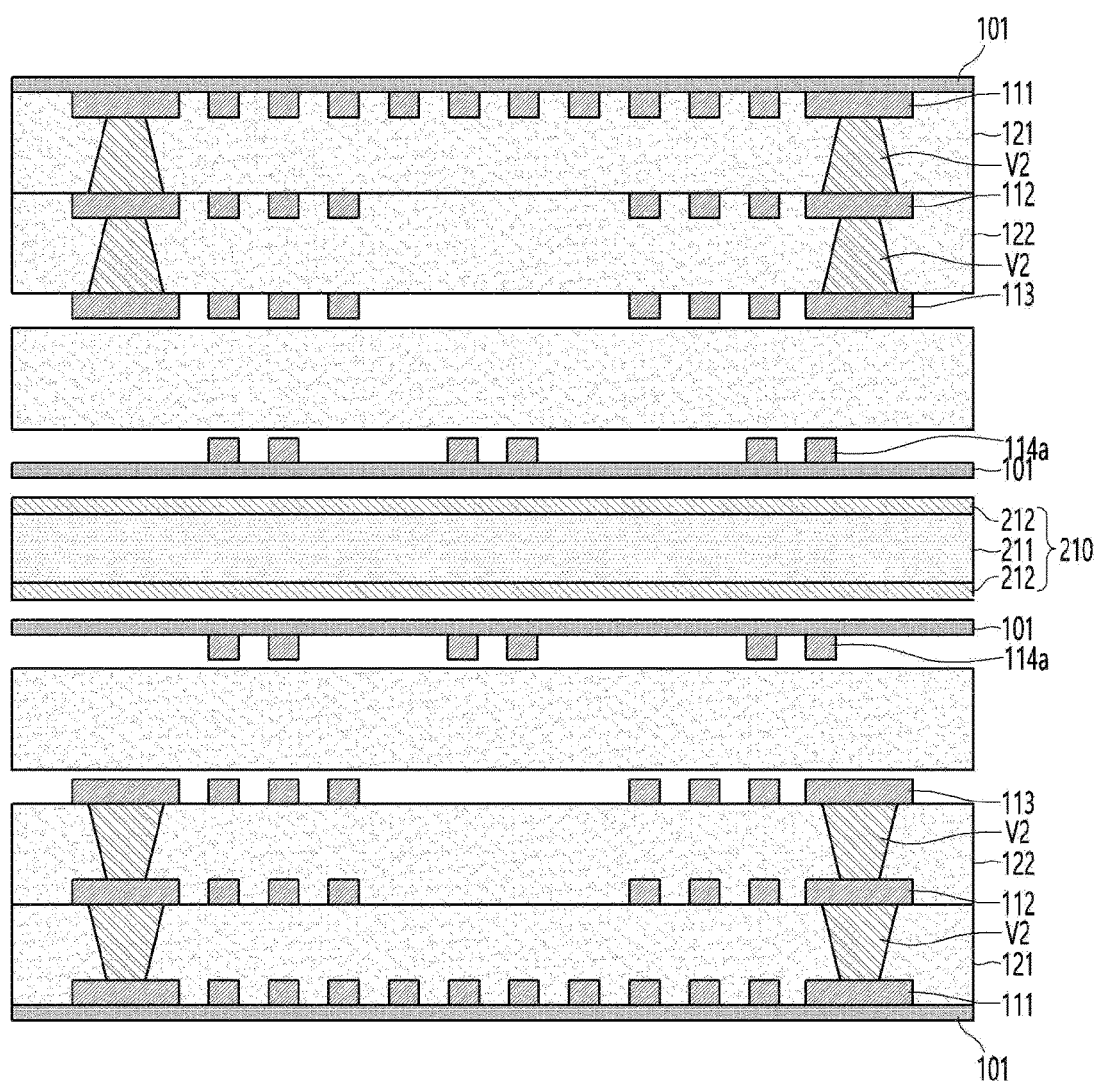

[FIG. 14]
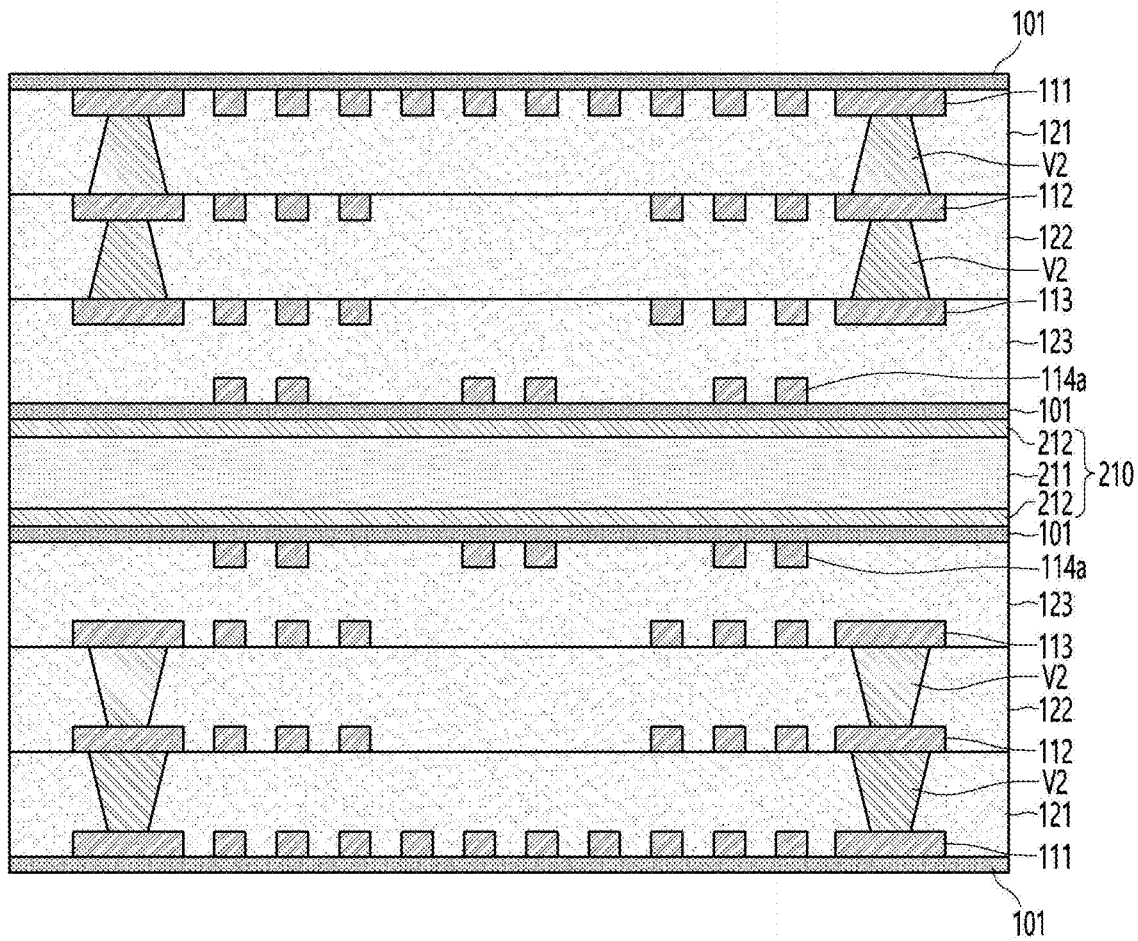
[FIG. 15]
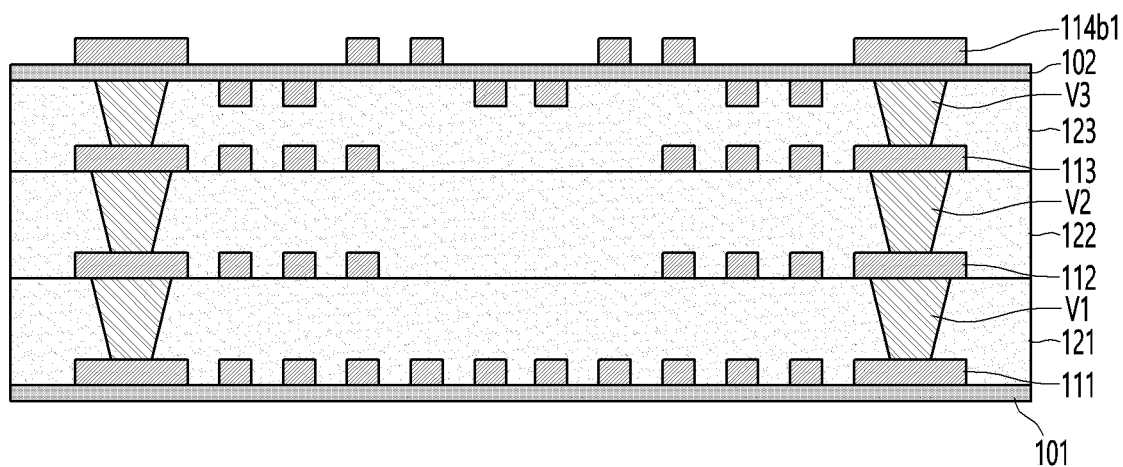

[FIG. 16]
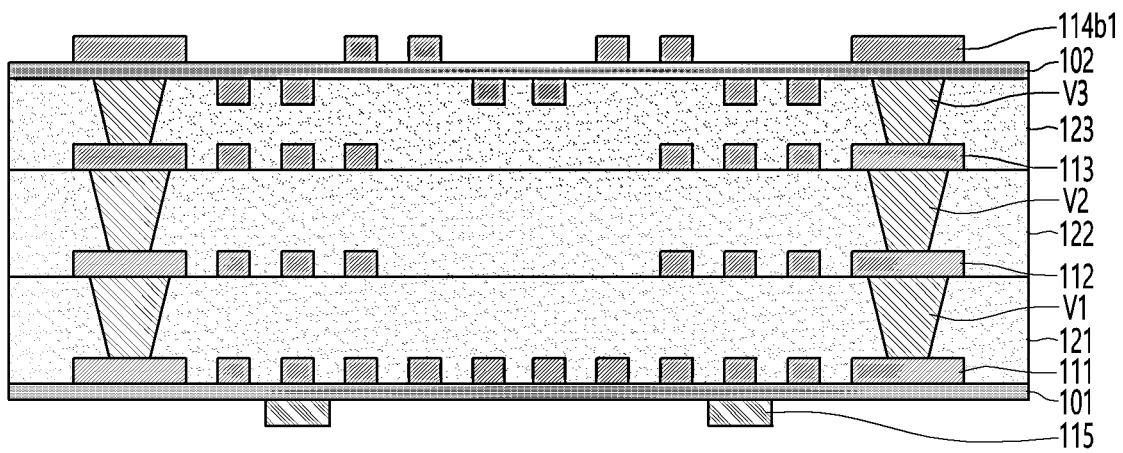
[FIG. 17]
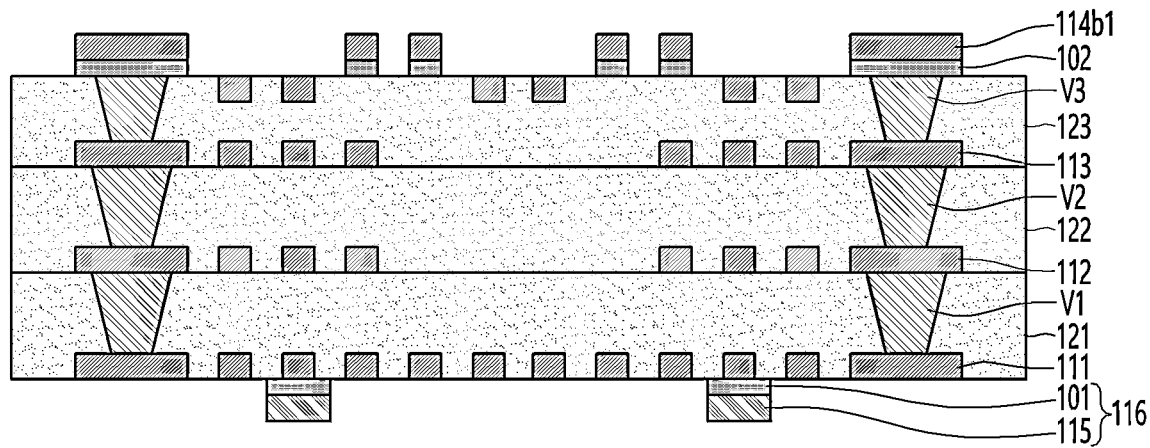

[FIG. 18]
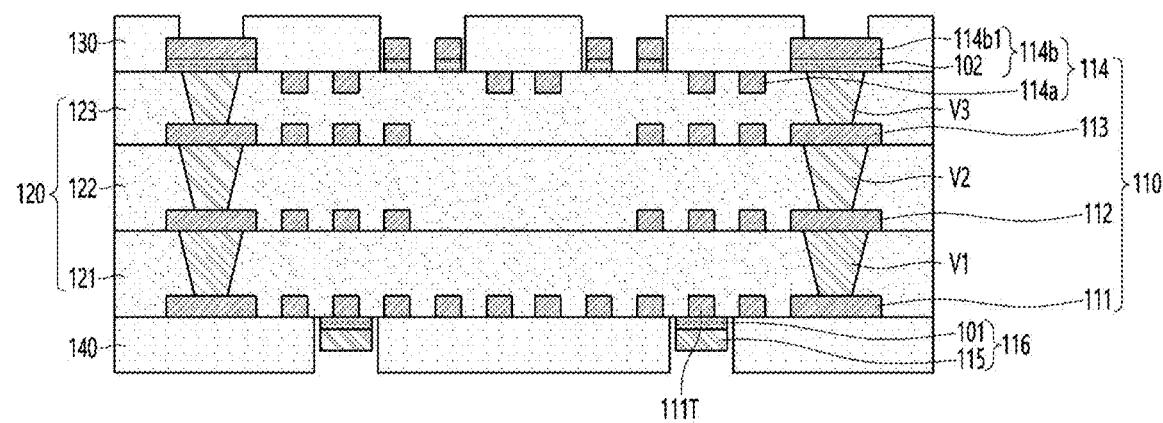

CIRCUIT BOARD

CROSS-REFERENCE TO RELATED PATENT APPLICATIONS

This application is a U.S. National Stage Application under 35 U.S.C. § 371 of PCT Application No. PCT/KR2021/005995, filed May 13, 2021, which claims priority to Korean Patent Application No. 10-2020-0057182, filed May 13, 2020, whose entire disclosures are hereby incorporated by reference.

TECHNICAL FIELD

An embodiment relates to a circuit board.

BACKGROUND ART

A line width of a circuit has been miniaturized as miniaturization, weight reduction, and integration of an electronic component are accelerated. In particular, as a design rule of a semiconductor chip is integrated on a nanometer scale, a circuit line width of a package substrate or a printed circuit board on which the semiconductor chip is mounted has been miniaturized to several micrometers or less.

Various methods have been proposed in order to increase the degree of circuit integration of the printed circuit board, that is, to reduce the circuit line width. For the purpose of preventing loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for miniaturizing the circuit pitch.

Meanwhile, recently, efforts have been made to develop an improved 5G (5th generation) communication system or a pre-5G communication system in order to meet a demand for wireless data traffic. Here, the 5G communication system uses ultra-high frequency (mmWave) bands (sub 6 GHZ, 28 GHZ, 38 GHz, or higher frequencies) to achieve high data transfer rates.

In addition, integration technologies such as beamforming, massive multi-input multi-output (massive MIMO), and array antennas have been developed in the 5G communication system in order to reduce a path loss of radio waves and increase a transmission distance of radio waves in the ultra-high frequency band. Antenna systems are relatively large given that they can consist of hundreds of active antennas of wavelengths in these frequency bands.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

And, the circuit board applied to the 5G communication system as described above is manufactured according to a trend of light, thin and compact, and accordingly, the circuit pattern is gradually becoming finer.

However, the circuit board including the conventional fine circuit pattern has a structure in which an outermost circuit pattern protrudes above the insulating layer, and thus the outermost circuit pattern easily collapses.

DISCLOSURE

Technical Problem

The embodiment provides a circuit board having a novel structure and a method of manufacturing the same.

In addition, the embodiment provides a circuit board including a circuit pattern disposed on one surface of an insulating layer, wherein a part of the circuit pattern is buried in one surface of the insulating layer and the other part protrudes on one surface of the insulating layer, and a method of manufacturing the same.

In addition, the embodiment provides a circuit board in which an additional pad layer for contact with solder is formed on a trace buried in an insulating layer through an ETS method, and a method of manufacturing the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes an insulating layer; a second outer circuit pattern disposed on an upper surface of the insulating layer; and a via disposed in the insulating layer and connected to the second outer circuit pattern; wherein the second outer circuit pattern includes: a first pattern embedded in the insulating layer and having a first width; and a second pattern protruding on the upper surface of the insulating layer, having a second width greater than the first width, and connected to the first pattern through the via.

In addition, the buried pattern is a fine circuit pattern having a width of 15 μm or less, and the protrusion pattern is a circuit pattern having a width greater than that of the buried pattern.

In addition, the buried pattern includes a signal pattern, and the protrusion pattern includes a ground pattern.

In addition, an upper surface of the buried pattern is positioned on the same plane as a lower surface of the protrusion pattern.

In addition, the protrusion pattern includes: a first plating layer disposed on the upper surface of the insulating layer; and a second plating layer disposed on an upper surface of the first plating layer.

In addition, the protrusion pattern does not overlap the buried pattern in a vertical direction.

In addition, the first outer circuit pattern includes a trace; and wherein a pad layer is disposed under the trace and is in direct contact with the trace.

In addition, a width of the pad layer has 150% or more of a width of the trace.

In addition, the circuit board further includes a first protective layer disposed on the upper surface of the insulating layer; and a second protective layer disposed under the lower surface of the insulating layer; wherein the first protective layer is disposed to cover an upper surface of the buried pattern, and wherein the second protective layer is disposed to cover a lower surface of the first outer circuit pattern.

In addition, the first protective layer includes a first opening exposing an upper surface of the protrusion pattern, and the second protective layer includes a second opening exposing a lower surface of the pad layer.

On the other hand, a manufacturing method of the circuit board according to the embodiment includes forming a first outer circuit pattern on a first carrier board; forming a first insulating layer covering the first outer circuit pattern on the first carrier board; forming a first via connected to the first outer circuit pattern in the first insulating layer; forming a first inner circuit pattern connected to the first via on an upper surface of the first insulating layer; removing the first carrier board; forming a buried pattern of a second outer circuit pattern on a second carrier board; pressurizing in a state in which a third insulating layer and the buried pattern of the second outer circuit pattern are disposed on the first inner circuit pattern so that the buried pattern is buried in an upper surface of the third insulating layer; removing the second carrier board; and forming a protrusion pattern of the second outer circuit pattern on an upper surface of the third insulating layer, wherein the buried pattern has a first width and is buried on the third insulating layer, wherein the protrusion pattern has a second width greater than the first width and protrudes on the upper surface of the third insulating layer, and an upper surface of the buried pattern is positioned on the same plane as a lower surface of the protrusion pattern.

In addition, the buried pattern includes a signal pattern having a width of 15 μm or less, and the protrusion pattern includes a ground pattern having a width greater than that of the buried pattern.

In addition, the protrusion pattern does not overlap the buried pattern in a vertical direction.

In addition, the first outer circuit pattern includes a trace, wherein the method of manufacturing the circuit board includes forming a pad layer in direct contact with the trace under an lower surface of the trace of the first outer circuit pattern when the protrusion pattern is formed, and wherein a width of the pad layer is 150% or more of a width of the trace.

In addition, the method for manufacturing the circuit board further includes forming a second insulating layer on the first insulating layer before removing the first carrier board; forming a second via in the second insulating layer; and forming a second inner circuit pattern on an upper surface of the second insulating layer, and wherein the third insulating layer is positioned between the second insulating layer and the buried pattern on the second carrier board.

In addition, the method for manufacturing the circuit board further includes forming a first protective layer covering an upper surface of the buried pattern on an upper surface of the third insulating layer, and forming a second protective layer covering a lower surface of the first outer circuit pattern under a lower surface of the first insulating layer.

In addition, the method for manufacturing the circuit board further includes forming a first opening exposing an upper surface of the protrusion pattern in the first protective layer, and forming a second opening exposing a lower surface of the pad layer in the second protective layer.

Advantageous Effects

According to an embodiment, the circuit board includes a first outer circuit pattern and a second outer circuit pattern disposed on different outermost sides of an insulating layer. In this case, the first outer circuit pattern has an ETS structure, and thus has a structure buried under the insulating layer. In this case, a first outer circuit pattern in a comparative example includes a mounting pad for external device mounting, and thus has a problem in that the degree of circuit integration is reduced by the width of the pad. Accordingly, the embodiment includes a pad layer separately formed on a lower surface of a trace of the first outer circuit pattern. The pad layer may have a width of at least 150% or more than a width of a trace of the first outer circuit pattern.

According to this, the embodiment can solve the problem of reducing the circuit density due to the arrangement of the mounting pad under the insulating layer. Specifically, the first outer circuit pattern buried under the insulating layer of the embodiment does not include a mounting pad, and accordingly, it is possible to secure a space corresponding to the mounting pad, thereby improving the degree of circuit integration.

In addition, a solder is not disposed directly on the trace of the embodiment, and the solder is disposed on a separate pad layer. Accordingly, the embodiment may improve the reliability of the connection between the solder and the trace by forming the pad layer.

On the other hand, the circuit board of the embodiment includes a second outer circuit pattern disposed on one side of the insulating layer opposite to the first outer circuit pattern. In this case, the second outer circuit pattern in a general ETS structure has a structure protruding on a surface of the insulating layer. In addition, when the second outer circuit pattern has a protruding structure, the second outer circuit pattern may collapse due to an external impact. In addition, the second outer circuit pattern in the comparative example has a protruding structure, and accordingly, a support layer supporting the second outer circuit pattern may be formed using a separate layer such as solder resist. However, when it has such a structure, a process of removing a portion of the support layer must be performed, and thus, a problem arises that resin residues remain on the surface of the second outer circuit pattern. In addition, a partial removal process of the support layer is proceeded through chemical polishing or physical polishing, and at this time, the second outer circuit pattern is lifted due to the non-uniformity of the polishing process.

Alternatively, the embodiment implements the second outer circuit pattern as a protrusion pattern and a buried pattern, respectively. That is, when the second outer circuit pattern is disposed on the upper surface of the insulating layer, a part of the second outer circuit pattern has a structure buried in an upper portion of the insulating layer. In addition, the remaining part of the second outer circuit pattern has a structure that protrudes on the upper surface of the insulating layer. In this case, the second outer circuit pattern includes a signal pattern for transmitting and receiving data signals and a ground pattern for power transmission or noise cancellation. The ground pattern has a line width greater than 15 μm, and thus has relatively strong characteristics against external impact. However, the signal pattern is formed to have a line width of at least 10 μm or less, thereby having a weak characteristic against external impact.

Accordingly, the embodiment functionally divides the second outer circuit pattern, so that the signal pattern has a structure buried in the insulating layer. In addition, the ground pattern of the second outer circuit pattern in the embodiment has a structure that protrudes on the upper surface of the insulating layer.

According to the embodiment, the signal pattern having a relatively small line width is disposed to be buried in the upper portion of the insulating layer, so that reliability problems such as collapse of the signal pattern due to an external impact can be solved.

In addition, the embodiment can minimize an interference between the signal pattern and the ground pattern by implementing the signal pattern and the ground pattern as a buried pattern and a protrusion pattern, respectively, and thus data transmission reliability can be improved.

In addition, the circuit board in the embodiment can be applied to the 5G communication system, thereby minimizing the transmission loss of the high frequency can further improve the reliability. Specifically, the circuit board in the embodiment can be used at a high frequency and can reduce propagation loss.

DESCRIPTION OF DRAWINGS

FIGS. 1A and 1B are views showing a circuit board according to a comparative example.

FIG. 2 is a view showing a circuit board manufactured by an ETS method in a comparative example.

FIG. 3 is a view showing a circuit board according to an embodiment.

FIG. 4 is a view specifically illustrating a first outer circuit pattern of FIG. 3.

FIG. 5 is a view specifically illustrating a second outer circuit pattern of FIG. 3.

FIGS. 6 to 18 are views illustrating a method of manufacturing a circuit board according to an exemplary embodiment in a process order.

BEST MODE

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

As used herein, the singular forms "a," "an" and "the" are intended to include the plural forms as well, unless the context clearly indicates otherwise.

It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Hereinafter, an embodiment of the present invention will be described in detail with reference to the accompanying drawings.

Before describing the present embodiment, a comparative example compared with the present embodiment will be described.

FIG. 1 is a view showing a circuit board according to a comparative example.

Referring to FIG. 1, as in (a), the circuit board according to the comparative example includes a circuit pattern manufactured by a general SAP method.

Specifically, the circuit board includes an insulating layer 10, a circuit pattern 20, and a protective layer 30.

The circuit pattern 20 is disposed on upper and lower surfaces of the insulating layer 10, respectively.

In this case, at least one of the circuit patterns 20 disposed on the surface of the insulating layer 10 includes a fine circuit pattern.

In FIG. 1, the circuit pattern 20 disposed on the upper surface of the insulating layer 10 includes a fine circuit pattern. The fine circuit pattern includes a trace 21 which is a signal transmission wiring line, and a pad 22 for chip mounting and the like.

At this time, since a supporting layer using solder resist is formed for the purpose of protecting the fine circuit pattern in the embodiment, the structure in the region where the fine circuit pattern is formed in the comparative example will be described.

In addition, a protective layer 30 for protecting the circuit pattern 20 is disposed on the surface of the insulating layer 10.

In this case, an upper region of the insulating layer 10 includes a first region in which the protective layer 30 is disposed and a second region that is an open region in which the protective layer 30 is not disposed.

Accordingly, a part of the circuit pattern 20 disposed on the upper surface of the insulating layer 10 is covered by the protective layer 30, and the remaining part is exposed to an outside without being covered by the protective layer 30.

In this case, the trace 21 and the pad 22 corresponding to the fine circuit pattern as described above are disposed in the second region that is an open region of the protective layer 30.

For example, at least one of the trace 21 and the pad 22 has a width/interval of 15 µm/15 µm or less.

In this case, when the circuit pattern formed in the open region of the protective layer 30 is a pattern having a width exceeding 15 µm rather than a fine circuit pattern, it may be strong against external impact.

However, as in FIG. 1 (b), the width and the interval of the trace 21, which is the fine circuit pattern of the outermost layer, is gradually being refined as the circuit pattern is gradually refined, and accordingly, when the fine circuit pattern protruding on the upper surface of the insulating layer 10 is disposed in the second region that is the open region of the protective layer, the fine circuit pattern easily collapses due to an external impact.

That is, as in B of FIG. 1 (b), the trace 21 corresponding to the fine circuit pattern of the outermost layer has an extremely fine pattern shape, and as a result, even a small impact from the outside can easily cause it to collapse or be swept away.

Further, a contact area between the insulating layer 10 and the trace 21 in the comparative example decreases as the width of the trace 21 becomes narrower. In addition, the bonding force between the insulating layer 10 and the trace 21 decreases as the contact area decreases.

On the other hand, recently, a fine circuit pattern disposed in the open region of the protective layer while having a structure buried in the insulating layer is formed by using the ETS method.

FIG. 2 is a view showing a circuit board manufactured by an ETS method in a comparative example.

Referring to FIG. 2, specifically, the circuit board includes an insulating layer 10A, a circuit pattern 20A, and a protective layer 30A.

The circuit pattern 20A is disposed on upper and lower surfaces of the insulating layer 10A, respectively.

In this case, at least one of the circuit patterns 20A disposed on the surface of the insulating layer 10A includes a fine circuit pattern.

Here, when the circuit pattern is formed by the ETS method, the circuit pattern initially formed has a structure buried in the insulating layer 10A. Accordingly, when the initially formed circuit pattern is formed as a fine circuit pattern, the fine circuit pattern may have a structure in which the fine circuit pattern is buried in the insulating layer 10A even in the comparative example.

That is, the circuit board manufactured by the ETS method includes a fine circuit pattern having a structure buried in the surface of the insulating layer 10A. That is, the fine circuit pattern includes a trace 21A, which is a signal transmission wiring line, and a pad 22A for mounting a chip or the like.

In addition, the fine circuit pattern disposed on one side of the circuit board manufactured by the ETS method as described above has a structure buried in the insulating layer, and thus the fine circuit pattern is protected from external impact. However, the fine circuit pattern disposed on the other side of the circuit board manufactured by the ETS method has a structure protruding from the surface of the insulating layer. In addition, the protrusion fine circuit pattern has the same problems as described with reference to FIGS. 1 (a) and (b).

In addition, interest in circuit boards that can reflect this is increasing with the development of 5G technology in recent years. At this time, the circuit board must have a high multi-layer structure in order to apply the 5G technology, and accordingly, the circuit pattern must be miniaturized. However, the comparative example is capable of forming a fine pattern, but there is a problem in that the fine pattern cannot be stably protected.

Accordingly, the embodiment intends to provide a circuit board having a new structure capable of solving the reliability problem of an outermost fine pattern and a method for controlling the same.

FIG. 3 is a view showing a circuit board according to an embodiment, FIG. 4 is a view specifically illustrating a first outer circuit pattern of FIG. 3, and FIG. 5 is a view specifically illustrating a second outer circuit pattern of FIG. 3.

Before describing FIGS. 3 to 5, the circuit board according to the embodiment may have a multilayer structure. Preferably, the circuit board according to the embodiment may have a four-layer structure based on a number of layers of the circuit pattern. However, this is only an example, and is not limited thereto. That is, the circuit board according to the embodiment may have a number of layers smaller than 4 layers, and alternatively may have a number of layers larger than 4 layers.

Referring to FIGS. 3 to 5, the circuit board 100 includes an insulating layer 120.

Preferably, the circuit board 100 may include a first insulating layer 121, a second insulating layer 122, and a third insulating layer 123 to implement a four-layer circuit pattern layer.

In this case, the second insulating layer 122 of the insulating layers 120 may be an inner insulating layer disposed inside the circuit board in a stacked insulating layer structure. In addition, the first insulating layer 121 and the third insulating layer 123 may be an outer insulating layer disposed outside the circuit board in a stacked insulating layer structure. For example, the first insulating layer 121 may be a first outer insulating layer disposed on a lowermost side of the circuit board. For example, the third insulating layer 123 may be a second outer insulating layer disposed on an uppermost side of the circuit board. Meanwhile, although it is illustrated that the second insulating layer 122 is formed as one layer in the drawing, the embodiment is not limited thereto. For example, the inner insulating layer may further include at least one additional insulating layer other than the second insulating layer 122 as the number of layers of the circuit pattern increases.

The second insulating layer 122 may be a core insulating layer disposed at a center in the stacked structure of the insulating layer 120. The third insulating layer 123 may be an upper insulating layer disposed on an upper surface of the second insulating layer 122. Also, the first insulating layer 121 may be a lower insulating layer disposed under the second insulating layer 122.

The insulating layer 120 is a substrate on which an electric circuit capable of changing wiring is formed, and may include all of a printed circuit board, a wiring board, and an insulating substrate made of an insulating material capable of forming circuit patterns on a surface.

For example, at least one of the first insulating layer 121, the second insulating layer 122, and the third insulating layer 123 may be rigid or flexible. For example, at least one of the first insulating layer 121, the second insulating layer 122, and the third insulating layer 123 may include glass or plastic. Specifically, at least one of the first insulating layer 121, the second insulating layer 122, and the third insulating layer 123 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, at least one of the first insulating layer 121, the second insulating layer 122, and the third insulating layer 123 may include an optically isotropic film. As an example, at least one of the first insulating layer 121, the second insulating layer 122, and the third insulating layer 123 may include cyclic olefin copolymer (COC), cyclic olefin polymer (COP), optically isotropic PC, optically isotropic polymethylmethacrylate (PMMA), or the like.

In addition, at least one of the first insulating layer 121, the second insulating layer 122, and the third insulating layer 123 may be partially bent while having a curved surface. That is, at least one of the first insulating layer 121, the second insulating layer 122, and the third insulating layer 123 may partially have a plane and may partially be bent while having a curved surface. Specifically, an end portion of the first insulating layer 111 may be bent while having a curved surface, or bent or crooked while having a surface with a random curvature. Accordingly, the circuit board in the embodiment is applicable to electronic devices having various shapes.

In addition, at least one of the first insulating layer 121, the second insulating layer 122, and the third insulating layer 123 may be a flexible substrate having flexibility. Further, at least one of the first insulating layer 121, the second insulating layer 122, and the third insulating layer 123 may be a curved or bent substrate. At this point, at least one of the first insulating layer 121, the second insulating layer 122, and the third insulating layer 123 may form a wiring layout for electrical wirings which connect circuit components based on a circuit design, and electrical conductors may be disposed on an insulating material. Further, electrical components may be mounted on at least of the insulating layer 120, and the insulating layer 120 may form wirings configured to connect the electrical components to make a circuit, and may mechanically fix the components besides functioning to electrically connect the components.

A circuit pattern may be disposed on surfaces of the first insulating layer 121, the second insulating layer 122, and the third insulating layer 123.

That is, the circuit pattern 110 may be disposed on each surface of the first insulating layer 121, the second insulating layer 122, and the third insulating layer 123 constituting the insulating layer 120.

Here, the circuit pattern 110 may include an inner-layer circuit pattern and an outer-layer circuit pattern. The inner circuit pattern may be a circuit pattern disposed inside the circuit board based on a stacked structure thereof. In addition, the outer circuit pattern may be a circuit pattern disposed on the outermost side in the stacked structure of the circuit board.

For example, the outer circuit pattern may include a first outer circuit pattern 111 disposed on a lower surface of the first insulating layer 121.

In addition, the outer circuit pattern may include a second outer circuit pattern 114 disposed on an upper surface of the third insulating layer 123.

In addition, the inner circuit pattern may include a first inner circuit pattern 112 disposed between the first insulating layer 121 and the second insulating layer 122.

In addition, the inner circuit pattern may include a second inner circuit pattern ( ) disposed between the second insulating layer 122 and the third insulating layer 123.

That is, the first inner circuit pattern 112 may be disposed on an upper surface of the first outer circuit pattern 111. In addition, the first inner circuit pattern 112 may be covered by the second insulating layer 122.

The second inner circuit pattern 113 may be disposed on an upper surface of the second insulating layer 122. In addition, the second inner circuit pattern 113 may be covered by the third insulating layer 123.

The outer circuit pattern may be disposed on a surface of an outermost insulating layer among the plurality of insulating layers.

Preferably, the outer circuit pattern may include a first outer circuit pattern 111 disposed on a lower surface of the first insulating layer 121 disposed at an lowermost portion of the insulating layer. At this time, the circuit board in the embodiment may be manufactured by the ETS method. Accordingly, the first outer circuit pattern 111 may have a structure buried in a lower surface of the first outer circuit pattern 111. For example, the first outer circuit pattern 111 may be disposed in the first insulating layer 121. For example, a lower surface of the first outer circuit pattern 111 may be positioned on the same plane as a lower surface of the first insulating layer 121. For example, a lower surface of the first outer circuit pattern 111 may be positioned higher than a lower surface of the first insulating layer 121. Accordingly, a side surface of the first outer circuit pattern 111 may contact the first insulating layer 121. In addition, the first outer circuit pattern 111 may be protected by the first insulating layer 121.

In addition, the outer circuit pattern may include a second outer circuit pattern 114 disposed on an upper surface of the third insulating layer 123 disposed on an uppermost portion of the plurality of insulating layers. In this case, one of the plurality of outer circuit patterns in a general ETS structure has a structure protruding above the surface of the insulating layer. In this case, the first outer circuit pattern 111 in the embodiment is a pattern formed to have a structure buried in the first insulating layer 121 in the ETS structure. Accordingly, the second outer circuit pattern 114 in a general ETS structure may have a structure protruding from the top surface of the third insulating layer 123.

In contrast, the second outer circuit pattern 114 in the embodiment includes a first pattern 114a and a second pattern 114b. The first pattern 114a may be a buried pattern buried in an insulating layer. Also, the second pattern 114b may be a protrusion pattern protruding from the surface of the insulating layer. Hereinafter, the first pattern 114a will be referred to as a 'buried pattern' and the second pattern 114b will be referred to as a 'protrusion pattern'.

In contrast, the second outer circuit pattern 114 in the embodiment includes the protrusion pattern 114b having a structure protruding one the upper surface of the third insulating layer 123. That is, the second outer circuit pattern 114 in the embodiment includes a protrusion pattern 114b having a structure protruding on an upper surface of the third insulating layer 123, and the protrusion pattern 114b includes a ground pattern. Accordingly, in the embodiment, ground characteristics of the circuit board by the protrusion pattern 114b can be improved, and the heat.

Furthermore, the second outer circuit pattern 114 of the embodiment may include a protrusion pattern and a buried pattern, accordingly, it is possible to improve the density of circuit patterns in a limited space, thereby reducing the volume of the circuit board. That is, the protrusion pattern 114b may have a structure protruding on an upper surface of the third insulating layer 123. For example, a lower surface of the protrusion pattern 114b may directly contact an upper surface of the third insulating layer. The protrusion pattern 114b may have a plurality of layer structures. For example, the protrusion pattern 114b may include a first plating layer 102 disposed on the upper surface of the third insulating layer 123. In addition, the protrusion pattern 114b may include a second plating layer 114b1 disposed on an upper surface of the first plating layer 102. The first plating layer 102 may be a seed layer. In addition, the second plating layer 114b1 may be a pattern layer disposed on the first plating layer 102 by an electrolytic plating method using the first plating layer 102 as a seed layer. However, the embodiment is not limited thereto, the protrusion pattern 114b may have a number of layers greater than two layers depending on a method of forming the protrusion pattern 114b, or may have a one-layer structure differently.

On the other hand, the second outer circuit pattern 114 in the circuit board of the general ETS structure includes only the protrusion pattern 114b. Alternatively, the second outer circuit pattern 114 in the present embodiment may include the buried pattern 114a. The buried pattern 114a may be on an upper surface of the third insulating layer 123. For example, the buried pattern 114a may be buried in an upper portion of the third insulating layer 123. For example, an upper surface of the buried pattern 114a may be positioned on the same plane as the upper surface of the third insulating layer 123.

That is, the second outer circuit pattern 114 in the embodiment may have a structure in which a part protrudes and a structure in which the remaining part is buried. For example, the remaining part of the second outer circuit pattern 114 may be partially buried in the third insulating layer 123, and thus the upper surface may be exposed through the upper surface of the third insulating layer 123. Here, the exposure may include not only exposure to an outside of the circuit board of the embodiment, but also exposure to other components.

Accordingly, a fine circuit pattern weak to external impact among the second outer circuit patterns 114 of the embodiment has a structure embedded in the upper surface of the third insulating layer 123. Accordingly, the electrical reliability of the fine circuit pattern may be improved. For example, the fine circuit pattern in the embodiment can be stably protected through the third insulating layer 123 to solve the problem of the fine circuit pattern collapsing due to external impact, and accordingly, it is possible to solve the problem that the electrical circuit is disconnected.

In addition, a bonding force may be improved by increasing an contact area between the fine circuit pattern and the third insulating layer 123. On the other hand, the meaning of "buried in the upper surface" means that at least a part of a side surface and a lower surface of the second outer circuit pattern 114 are covered with the third insulating layer 123 and at least a part of an upper surface of the second outer circuit pattern 114 is exposed to an upper side of the third insulating layer 123.

In this case, the buried pattern 114a and the protrusion pattern 114b may not overlap each other in a vertical direction. However, the buried pattern 114a and the protrusion pattern 114b may be electrically connected to each other. For example, one end of the buried pattern 114a and one end of the protrusion pattern 114b may contact the third via V3, and thus may be electrically connected to each other.

The buried pattern 114a may have a first width W1. For example, the buried pattern 114a may have a width of 15 μm or less. For example, the buried pattern 114a may have a width of 12 μm or less. For example, the buried pattern 114a may have a width of 10 μm or less. That is, the buried pattern 114a in the embodiment is a fine circuit pattern, and thus a part of the buried pattern 114a is buried in the third insulating layer 123 to be stably protected from impact.

The protrusion pattern 114b may have a second width W2 greater than the first width W1. For example, the protrusion pattern 114b may have a width greater than 15 μm. For example, the protrusion pattern 114b may have a width greater than 18 μm. For example, the protrusion pattern 114b may have a width greater than 20 μm. That is, the protrusion pattern 114b is a pad on which a device such as a chip is mounted, and may have a second width W2 greater than the first width W1. Accordingly, the protrusion pattern 114b in the embodiment protrudes on the upper surface of the third insulating layer 123, thereby improving the degree of integration of the circuit pattern and improving the heat dissipation of the circuit board.

That is, the second outer circuit pattern 114 in the embodiment may be divided into a fine circuit pattern and a general circuit pattern according to functions. Further, the fine circuit pattern among the second outer circuit patterns 114 in the embodiment is formed as a buried pattern 114a having a structure buried in the third insulating layer 123. In addition, the general circuit pattern among the second outer circuit patterns 114 of the embodiment is formed as a protrusion pattern 114b having a structure protruding on the upper surface of the third insulating layer 123. Accordingly, the second outer circuit pattern 114 disposed on the upper surface of the third insulating layer 123 may include a protrusion pattern 114b and a buried pattern 114a. In addition, a lower surface of the protrusion pattern 114b and an upper surface of the buried pattern 114a may be positioned on the same plane.

Consequently, the second outer circuit pattern 114 may include a fine circuit pattern. For example, the second outer circuit pattern 114 may include a fine circuit pattern having a line width of 10 μm or less and an interval between the patterns of 10 μm or less. In addition, when the fine circuit pattern has a structure protruding above the third insulating layer 123, reliability such as peeling of the fine circuit pattern may be reduced. Accordingly, the fine circuit pattern of the second outer circuit pattern 114 in the embodiment is buried in the third insulating layer 123, and other general circuit patterns except this are protruded on the third insulating layer 123.

Meanwhile, the first inner circuit pattern 112, the second inner circuit pattern 113, the first outer circuit pattern 111 and the second outer circuit pattern 114 may be a wiring for transmitting an electrical signal, and may be formed of a metal material having high electrical conductivity. For this, the first inner circuit pattern 112, the second inner circuit pattern 113, the first outer circuit pattern 111 and the second outer circuit pattern 114 may be formed of at least one metal material selected from among gold (Au), silver (Ag), platinum (Pt), titanium (Ti), tin (Sn), copper (Cu), and zinc (Zn). In addition, the first inner circuit pattern 112, the second inner circuit pattern 113, the first outer circuit pattern 111 and the second outer circuit pattern 114 may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the first inner circuit pattern 112, the second inner circuit pattern 113, the first outer circuit pattern 111 and the second outer circuit pattern 114 may be formed of copper (Cu) having high electrical conductivity and a relatively low cost.

Meanwhile, a via may be disposed in the insulating layer 120. The via is disposed in each insulating layer, and thus may serve to electrically connect circuit patterns disposed in different layers to each other.

A first via V1 may be disposed in the first insulating layer 121. The first via V1 may be electrically connected a first inner circuit pattern 112 disposed on the upper surface of the first insulating layer 121 and the first outer circuit pattern 111 buried in the lower surface of the first insulating layer 121.

A second via V2 may be disposed in the second insulating layer 122. The second via V2 may be electrically connected a first inner circuit pattern 112 disposed on an upper surface of the first insulating layer 121 and a second inner circuit pattern 113 disposed on an upper surface of the second insulating layer 122. A third via V3 may be disposed in the third insulating layer 123. The third via V3 may be electrically connected a second inner circuit pattern 113 disposed on an upper surface of a second outer circuit pattern 114 and a second outer circuit pattern 114 disposed on an upper surface of the third insulating layer 123.

The via may be formed by filling the inside of a via hole passing through each insulating layer with a conductive material.

The via hole may be formed by any one of machining methods, including mechanical, laser, and chemical machining. When the via hole is formed by machining, methods such as milling, drilling, and routing can be used, and when the via hole is formed by laser processing, a UV or $CO_2$ laser method can be used, and when the via hole is formed by chemical processing, drugs including amino silane, ketones, etc. may be used, and accordingly, the insulating layer may be opened.

On the other hand, the processing by the laser is a cutting method in which optical energy is concentrated on the surface to melt and evaporate a part of the material to take a desired shape, and it can easily process complex formations by computer programs, and can process composite materials that are difficult to cut by other methods.

In addition, the processing by the laser can have a cutting diameter of at least 0.005 mm, and has a wide advantage in a range of possible thicknesses.

As the laser processing drill, it is preferable to use a YAG (Yttrium Aluminum Garnet) laser, a $CO_2$ laser, or an ultraviolet (UV) laser. The YAG laser is a laser that can process both the copper foil layer and the insulating layer, and the $CO_2$ laser is a laser that can process only the insulating layer.

When the via hole is formed, the first via to third via V1, V2 and V3 may be formed by filling the inside of the through hole with a conductive material. Metal materials forming the first via to third via V1, V2 and V3 may be any one material selected from copper (Cu), silver (Ag), tin (Sn), gold (Au), nickel (Ni) and palladium (Pd), and the conductive material may be filled by any one of electroless plating, electrolytic plating, screen printing, sputtering, evaporation, ink-jetting, and dispensing.

Meanwhile, a pad layer 116 may be disposed on a lower surface of the first insulating layer 121. The pad layer 116 may overlap a part of the first outer circuit pattern 111 buried in a lower surface of the first insulating layer 121 in a vertical direction. For example, the pad layer 116 may be formed under a lower surface of the first outer circuit pattern 111 disposed under the lower surface of the first insulating layer 121.

Specifically, the first outer circuit pattern 111 may include via pads and traces 111T according to functions. The pad may mean a pad connected to a first via V1. The first outer circuit pattern 111 may include a mounting pad on which solder for device mounting is disposed. In this case, the first outer circuit pattern 111 is a fine circuit pattern. Accordingly, an interval between each pattern constituting the first outer circuit pattern 111 is narrow, so a space for arranging the mounting pad may not be provided. For example, when forming the first outer circuit pattern 111, the mounting pad may be formed to have a structure buried in the first insulating layer 121. However, there is a problem in that a number of first outer circuit patterns 111 arranged in a limited space to correspond to the width of the mounting pad decreases, and thus the degree of integration decreases. Accordingly, when the first outer circuit pattern 111 is formed as described above, the embodiment forms only the remaining patterns except for the mounting pad, and the mounting pad is formed by further performing a plating process later.

Accordingly, the pad layer 116 of the embodiment is disposed on the lower surface of the trace 111T of the first outer circuit pattern 111. The pad layer 116 may be disposed to have a structure surrounding a lower surface of the trace 111T. For example, a width of the pad layer 116 may be 150% or more of a width of the trace 111T. For example, a width of the pad layer 116 may be 180% or more of a width of the trace 111T. For example, a width of the pad layer 116 may be 200% or more of a width of the trace 111T. The pad layer 116 may serve to increase a contact area between solder (not shown) and the first outer circuit pattern 111. For example, the pad layer 116 may improve the reliability of the connection between the solder and the trace 111T of the first outer circuit pattern 111.

Meanwhile, a protective layer may be disposed on an outermost side of a circuit board. Preferably, a first protective layer 130 may be disposed on an upper surface of the third insulating layer 123. Also, a second protective layer 140 may be disposed on a lower surface of the first insulating layer 121.

The first protective layer 130 and the second protective layer 140 may be formed of at least one layer using any one or more of Solder Resist (SR), oxide, and Au. Preferably, the first protective layer 130 and the second protective layer 140 may be solder resist.

The first protective layer 130 may be disposed on the third insulating layer 123 to protect the second outer circuit pattern 114.

For example, the first protective layer 130 may protect a surface of the buried pattern 114a of the second outer circuit pattern 114. For example, the first protective layer 130 may be disposed to cover an upper surface of the buried pattern 114a. In addition, the first protective layer 130 may include an opening (not shown) exposing the protrusion pattern 114b.

The second protective layer 140 may be disposed on the first insulating layer 121 to protect the first outer circuit pattern 111. For example, the second protective layer 140 may be disposed to cover the surface of the first outer circuit pattern 111 buried in the lower surface of the first insulating layer 121. For example, the second protective layer 140 may include an opening (not shown) exposing the pad layer 116 disposed on the lower surface of the first insulating layer 121.

Hereinafter, the second outer circuit pattern 114 and the pad layer 116 will be described in detail.

In the embodiment, the second outer circuit pattern 114 disposed on the upper surface of the third insulating layer 123 is included.

In this case, the second outer circuit pattern 114 may have different widths according to functions. For example, the second outer circuit pattern 114 may include a ground pattern for power supply or noise cancellation. At this time, the ground pattern is in charge of a function related to power, and accordingly, if the pattern width thereof is made fine, there is a high possibility that a disconnection due to an increase in resistance occurs. Accordingly, a general ground pattern may have a width greater than 15 μm to improve reliability. For example, the ground pattern may have a width greater than 20 μm to improve reliability.

In addition, the second outer circuit pattern 114 may include a signal pattern for transmitting and receiving data signals. In addition, a number of the signal patterns may increase according to the amount of data to be transmitted.

Accordingly, a general signal pattern is composed of a fine pattern. For example, the signal pattern may have a width of 15 µm or less. For example, the signal pattern may have a width of 12 µm or less. For example, the signal pattern may have a width of 10 µm or less.

As described above, the second outer circuit pattern 114 includes a signal pattern and a ground pattern. And, since the line width of the ground pattern is greater than 15 µm, it has relatively strong characteristics against external impact. However, since the signal pattern is formed with a line width of at least 10 µm or less, it has a weak characteristic against external impact.

Accordingly, the second outer circuit pattern 114 in the embodiment is functionally divided, and accordingly, the signal pattern is implemented as a buried pattern 114a having a structure buried in an upper portion of the third insulating layer 123. In addition, the ground pattern of the second outer circuit pattern 114 in the embodiment is implemented as a protrusion pattern 114b having a structure protruding on an upper surface of the third insulating layer 123.

According to an embodiment, a signal pattern having a relatively fine line width is disposed so as to be buried in an upper portion of the third insulating layer 123, and accordingly, reliability problems such as collapse of the signal pattern due to an external impact can be solved.

In addition, the embodiment divides the signal pattern and the ground pattern into a buried pattern 114a and a protrusion pattern 114b, respectively. Accordingly, mutual interference between the signal pattern and the ground pattern may be minimized, and thus data transmission reliability may be improved.

Referring to FIG. 4, the buried pattern 114a may have a first width W1. For example, the buried pattern 114a may have a width of 15 µm or less. For example, the buried pattern 114a may have a width of 12 µm or less. For example, the buried pattern 114a may have a width of 10 µm or less.

The protrusion pattern 114b may have a second width W2 greater than the first width W1. For example, the protrusion pattern 114b may have a width greater than 15 µm. For example, the protrusion pattern 114b may have a width greater than 18 µm. For example, the protrusion pattern 114b may have a width greater than 20 µm.

That is, as described above, the second outer circuit pattern 114 may be divided into a signal pattern and a ground pattern according to functions. And, the signal pattern formed as a fine circuit pattern among the second outer circuit patterns 114 in the embodiment is formed as a buried pattern 114a having a structure buried in the third insulating layer 123. In addition, the ground pattern of the second outer circuit pattern 114 in the embodiment forms a protruding structure on an upper surface of the third insulating layer 123 as a protrusion pattern 114b. Accordingly, the second outer circuit pattern 114 disposed on the upper surface of the third insulating layer 123 may include a protrusion pattern 114b and a buried pattern 114a. In addition, a lower surface of the protrusion pattern 114b and an upper surface of the buried pattern 114a may be positioned on the same plane.

Consequently, the second outer circuit pattern 114 may include a fine circuit pattern. For example, the second outer circuit pattern 114 may include a fine circuit pattern having a line width of 10 µm or less and an interval between the patterns of 10 µm or less. In addition, when the signal pattern corresponding to the fine circuit pattern has a structure that protrudes on the third insulating layer 123, reliability of the fine circuit pattern may be deteriorated. Accordingly, the fine circuit pattern of the second outer circuit pattern 114 in the embodiment is buried in the third insulating layer 123, and other general circuit patterns (eg, a ground pattern) protrude on the third insulating layer 123.

Meanwhile, referring to FIG. 5, the first outer circuit pattern 111 is buried in a lower portion of the first outer circuit pattern 111.

The first outer circuit pattern 111 includes a trace 111T. The trace 111T corresponds to a signal pattern that is a fine circuit pattern. Accordingly, the trace 111T has a line width of 15 µm or less. For example, the trace 111T has a line width of 12 µm or less. For example, the trace 111T has a line width of 10 µm or less.

And, the first outer circuit pattern 111 in a general ETS structure includes a pad for disposing a solder for mounting a device. In addition, the pad constitutes a part of the first outer circuit pattern 111, and thus has a structure buried in a lower portion of the first insulating layer 121. In this case, when the pad has a structure buried in a lower portion of the first insulating layer 121, the degree of integration with respect to pattern arrangement is reduced by a width of the pad.

Accordingly, a separate pad layer 116 in the embodiment is formed on a lower surface of the trace 111T constituting the first outer circuit pattern 111. The pad layer 116 is disposed on the lower surface of the trace 111T of the first outer circuit pattern 111 disposed in the first insulating layer 121.

The pad layer 116 may be disposed to have a structure surrounding a lower surface of the trace 111T. For example, a width of the pad layer 116 may be 150% or more of the width of the trace 111T. For example, a width of the pad layer 116 may be 180% or more of the width of the trace 111T. For example, a width of the pad layer 116 may be 200% or more of the width of the trace 111T. The pad layer 116 may serve to increase a contact area between solder (not shown) and the first outer circuit pattern 111. For example, the pad layer 116 may improve the reliability of the connection between the solder and the trace 111T of the first outer circuit pattern 111.

According to an embodiment, the circuit board includes a first outer circuit pattern and a second outer circuit pattern disposed on different outermost sides of an insulating layer. In this case, the first outer circuit pattern has an ETS structure, and thus has a structure buried under the insulating layer. In this case, a first outer circuit pattern in a comparative example includes a mounting pad for external device mounting, and thus has a problem in that the degree of circuit integration is reduced by the width of the pad. Accordingly, the embodiment includes a pad layer separately formed on a lower surface of a trace of the first outer circuit pattern. The pad layer may have a width of at least 150% or more than a width of a trace of the first outer circuit pattern.

According to this, the embodiment can solve the problem of reducing the circuit density due to the arrangement of the mounting pad under the insulating layer. Specifically, the first outer circuit pattern buried under the insulating layer of the embodiment does not include a mounting pad, and accordingly, it is possible to secure a space corresponding to the mounting pad, thereby improving the degree of circuit integration.

In addition, a solder is not disposed directly on the trace of the embodiment, and the solder is disposed on a separate pad layer. Accordingly, the embodiment may improve the reliability of the connection between the solder and the trace by forming the pad layer.

On the other hand, the circuit board of the embodiment includes a second outer circuit pattern disposed on one side of the insulating layer opposite to the first outer circuit pattern. In this case, the second outer circuit pattern in a general ETS structure has a structure protruding on a surface of the insulating layer. In addition, when the second outer circuit pattern has a protruding structure, the second outer circuit pattern may collapse due to an external impact. In addition, the second outer circuit pattern in the comparative example has a protruding structure, and accordingly, a support layer supporting the second outer circuit pattern may be formed using a separate layer such as solder resist. However, when it has such a structure, a process of removing a portion of the support layer must be performed, and thus, a problem arises that resin residues remain on the surface of the second outer circuit pattern. In addition, a partial removal process of the support layer is proceeded through chemical polishing or physical polishing, and at this time, the second outer circuit pattern is lifted due to the non-uniformity of the polishing process.

Alternatively, the embodiment implements the second outer circuit pattern as a protrusion pattern and a buried pattern, respectively. That is, when the second outer circuit pattern is disposed on the upper surface of the insulating layer, a part of the second outer circuit pattern has a structure buried in an upper portion of the insulating layer. In addition, the remaining part of the second outer circuit pattern has a structure that protrudes on the upper surface of the insulating layer. In this case, the second outer circuit pattern includes a signal pattern for transmitting and receiving data signals and a ground pattern for power transmission or noise cancellation. The ground pattern has a line width greater than 15 µm, and thus has relatively strong characteristics against external impact. However, the signal pattern is formed to have a line width of at least 10 µm or less, thereby having a weak characteristic against external impact.

Accordingly, the embodiment functionally divides the second outer circuit pattern, so that the signal pattern has a structure buried in the insulating layer. In addition, the ground pattern of the second outer circuit pattern in the embodiment has a structure that protrudes on the upper surface of the insulating layer.

According to the embodiment, the signal pattern having a relatively small line width is disposed to be buried in the upper portion of the insulating layer, so that reliability problems such as collapse of the signal pattern due to an external impact can be solved.

In addition, the embodiment can minimize an interference between the signal pattern and the ground pattern by implementing the signal pattern and the ground pattern as a buried pattern and a protrusion pattern, respectively, and thus data transmission reliability can be improved.

In addition, the circuit board in the embodiment can be applied to the 5G communication system, thereby minimizing the transmission loss of the high frequency can further improve the reliability. Specifically, the circuit board in the embodiment can be used at a high frequency and can reduce propagation loss.

FIGS. 6 to 18 are views illustrating a method of manufacturing a circuit board according to an exemplary embodiment in a process order Firstly, the circuit board of the embodiment may be manufactured in a manner of manufacturing a plurality of substrates from each of both sides of a carrier board using the carrier board. That is, a plurality of substrates in the embodiment may be manufactured at once on both sides of the carrier board by applying the ETS method. However, the second outer circuit pattern 114 of the embodiment has a structure including the buried pattern 114a and the protrusion pattern 114b. In this case, when using the ETS method, the embodiment may additionally perform a process of separately manufacturing the buried substrate including the buried pattern 114a.

Referring to FIG. 6, the embodiment prepares a first carrier board 210.

The first carrier board 210 may have an insulating member 211 and a structure in which metal layers 212 are disposed on both surfaces of the insulating member 211, respectively.

When the first carrier board 210 is prepared, a process of forming a plating layer 101 on the metal layer 212 of the first carrier board 210 may be performed. The plating layer 101 may be a seed layer for forming the first outer circuit pattern 111 according to an embodiment. The plating layer 101 may be formed by a chemical copper plating process, but is not limited thereto.

Next, referring to FIG. 7, a process of forming the first outer circuit pattern 111 on the plating layer 101 may be performed.

The first outer circuit pattern 111 may be formed by the following process. When the plating layer 101 is formed, a mask (not shown) is formed on the plating layer. Then, the formed mask is exposed and developed to form an opening (not shown) exposing a region where the first outer circuit pattern 111 is to be formed.

Then, when an opening is formed in the mask, electrolytic plating is performed on the plating layer 101 as a seed layer to form a first outer circuit pattern 111 filling the opening of the mask.

Next, referring to FIG. 8, a first insulating layer 121 covering the first outer circuit pattern 111 is formed on the plating layer 101.

Next, referring to FIG. 9, a process of forming a first via V1 in the first insulating layer 121 may be performed.

The first via V1 may be formed by forming a via hole in the first insulating layer 121 and filling the formed via hole with a metal material.

In addition, the first inner circuit pattern 112 protruding from the surface of the first insulating layer 121 may be formed during the forming process of the first via V1.

Accordingly, the first via V1 may connect the first outer circuit pattern 111 and the first inner circuit pattern 112 to each other.

Next, referring to FIG. 10, a lamination process in which the processes of FIGS. 8 and 9 are additionally performed may be performed.

That is, the embodiment may proceed with a process of forming the second insulating layer 122 covering the first inner circuit pattern 112 on the first insulating layer 121.

Also, when the second insulating layer 122 is formed, the embodiment may proceed with a process of forming a second via V2 in the second insulating layer 122.

Also, when the second via V2 is formed, the embodiment may proceed with a process of forming the second inner circuit pattern 113 on the surface of the second insulating layer 122.

Next, referring to FIG. 11, a process of separating the substrate manufactured by FIGS. 6 to 10 into a plurality of substrates may be performed. That is, as described above, in the embodiment, a process of manufacturing a substrate is performed on both sides of the first carrier board 210, and thus two substrates may be manufactured at the same time.

And, when a process of forming the second inner circuit pattern 113 is completed as described above, a process of separating the substrates disposed on both sides of the first carrier board 210 from each other may be performed by removing the first carrier board 210.

Next, referring to FIG. 12, the embodiment may additionally proceed with a process of manufacturing the buried substrate differently from the conventional ETS method.

Referring to FIG. 12, the embodiment proceeds with a process of preparing the second carrier board 220 for manufacturing the buried substrate.

The second carrier board 220 may have an insulating member 221 and a structure in which a metal layer 222 is disposed on both surfaces of the insulating member 221, respectively.

When the second carrier board 220 is prepared, a process of forming the first plating layer 102 on the metal layer 222 of the second carrier board 220 may be performed. The first plating layer 102 may be a seed layer for forming the second outer circuit pattern 114 according to the embodiment. The first plating layer 102 may be formed by a chemical copper plating process, but is not limited thereto.

In addition, when the first plating layer 102 is formed on the second carrier board 220, the embodiment may proceed with a process of forming a part of the second outer circuit pattern 114 on the first plating layer 102. That is, the embodiment may proceed with the process of forming the buried pattern 114a among the second outer circuit patterns 114 on the first plating layer 102.

The buried pattern 114a of the second outer circuit pattern 114 may be formed by the following process. When the first plating layer 102 is formed, a mask (not shown) is formed on the first plating layer 102. Then, the formed mask is exposed and developed to form an opening (not shown) exposing a region where the buried pattern 114a of the second outer circuit pattern 114 is to be formed.

Then, when an opening is formed in the mask, electrolytic plating is performed on the first plating layer 102 as a seed layer to form a second outer circuit pattern 114 filling the opening of the mask.

Next, referring to FIGS. 13 and 14, a process of bonding a substrate manufactured using the first carrier board 210 on the buried substrate may be performed.

Specifically, the buried substrate manufactured through the second carrier board 220 includes the first plating layer 102 and the buried pattern 114a of the second outer circuit pattern 114.

In addition, the substrate manufactured and separated through the first carrier board 210 includes a first insulating layer 121, a second insulating layer 122, a first outer circuit pattern 111, a first inner circuit pattern 112, and a second inner circuit pattern 113.

In addition, the embodiment may proceed with a process of arranging the third insulating layer 123 on the buried pattern 114a and a process of arranging the substrate separated from the first carrier board 210 on the third insulating layer. In this case, the second insulating layer 122 of the separated substrate is disposed on the third insulating layer 123.

When an arrangement process as described above is completed, the embodiment may proceed with a process of thermocompression bonding the third insulating layer 123 and the buried pattern 114a to the second insulating layer 122.

Accordingly, the buried pattern 114a of the embodiment may have a structure to be buried in the third insulating layer 123 before the third insulating layer 123 is cured. In addition, a curing process may be performed after the buried pattern 114a is buried in the third insulating layer 123, and accordingly, the second insulating layer 122 and the third insulating layer 123 may be bonded to each other.

Next, referring to FIG. 15, a process of separating each manufactured substrate from both sides of the second carrier board 220 may be performed by separating the second carrier board 220.

Accordingly, the embodiment may manufacture two substrates having a structure in which the plating layer 101, the first outer circuit pattern 111, the first insulating layer 121, the first via V1, the first inner circuit pattern 112, the second insulating layer 122, the second via V2, the second inner circuit pattern 113, the third insulating layer 123, the third via V3, the buried pattern 114a of the second outer circuit pattern 114, and the first plating layer 102 are disposed from a lower side.

And, thereafter, a following processes may be performed for each of the two manufactured substrates, and accordingly, a process of manufacturing the circuit board may be finally performed.

Firstly, a process of forming a protrusion pattern 114b of the second outer circuit pattern 114 on the first plating layer 102 may be performed.

Next, referring to FIG. 16, a process of forming the pad layer 116 on a lower surface of the plating layer 101 may be performed.

Thereafter, referring to FIG. 17, a process of removing the plating layer 101 and the first plating layer 102 may be performed. In this case, the plating layer 101 and the first plating layer 102 in the region where the protrusion pattern 114b is formed and the pad layer 116 are formed are not removed in the process of removing the plating layer 101 and the first plating layer 102. Accordingly, the protrusion pattern 114b may have a structure including the first plating layer 102 and the second plating layer 114b1. In addition, the pad layer 116 may have a structure including the plating layer 101 and the pad metal layer 115 on the plating layer 101.

Next, referring to FIG. 18, the embodiment may proceed with a process of forming the first protective layer 130 on the third insulating layer 123.

In addition, the embodiment may proceed with a process of forming the second protective layer 140 under the first insulating layer 121.

The first protective layer 130 and the second protective layer 140 may be formed of at least one layer using any one or more of Solder Resist (SR), oxide, and Au. Preferably, the first protective layer 130 and the second protective layer 140 may be solder resist.

The first protective layer 130 may be disposed on the third insulating layer 123 to protect the second outer circuit pattern 114.

For example, the first protective layer 130 may protect a surface of the buried pattern 114a of the second outer circuit pattern 114. For example, the first protective layer 130 may be disposed to cover an upper surface of the buried pattern 114a. In addition, the first protective layer 130 may include an opening (not shown) exposing the protrusion pattern 114b.

The second protective layer 140 may be disposed on the first insulating layer 121 to protect the first outer circuit pattern 111. For example, the second protective layer 140 may be disposed to cover the surface of the first outer circuit pattern 111 buried in the lower surface of the first insulating layer 121. For example, the second protective layer 140 may include an opening (not shown) exposing the pad layer 116 disposed on the lower surface of the first insulating layer 121.

That is, as described above, the second outer circuit pattern 114 of the embodiment is buried in the third insulating layer 123 by performing an additional process of manufacturing a buried substrate and performing a process of thermocompression bonding.

According to an embodiment, the circuit board includes a first outer circuit pattern and a second outer circuit pattern disposed on different outermost sides of an insulating layer. In this case, the first outer circuit pattern has an ETS structure, and thus has a structure buried under the insulating layer. In this case, a first outer circuit pattern in a comparative example includes a mounting pad for external device mounting, and thus has a problem in that the degree of circuit integration is reduced by the width of the pad. Accordingly, the embodiment includes a pad layer separately formed on a lower surface of a trace of the first outer circuit pattern. The pad layer may have a width of at least 150% or more than a width of a trace of the first outer circuit pattern.

According to this, the embodiment can solve the problem of reducing the circuit density due to the arrangement of the mounting pad under the insulating layer. Specifically, the first outer circuit pattern buried under the insulating layer of the embodiment does not include a mounting pad, and accordingly, it is possible to secure a space corresponding to the mounting pad, thereby improving the degree of circuit integration.

In addition, a solder is not disposed directly on the trace of the embodiment, and the solder is disposed on a separate pad layer. Accordingly, the embodiment may improve the reliability of the connection between the solder and the trace by forming the pad layer.

On the other hand, the circuit board of the embodiment includes a second outer circuit pattern disposed on one side of the insulating layer opposite to the first outer circuit pattern. In this case, the second outer circuit pattern in a general ETS structure has a structure protruding on a surface of the insulating layer. In addition, when the second outer circuit pattern has a protruding structure, the second outer circuit pattern may collapse due to an external impact. In addition, the second outer circuit pattern in the comparative example has a protruding structure, and accordingly, a support layer supporting the second outer circuit pattern may be formed using a separate layer such as solder resist. However, when it has such a structure, a process of removing a portion of the support layer must be performed, and thus, a problem arises that resin residues remain on the surface of the second outer circuit pattern. In addition, a partial removal process of the support layer is proceeded through chemical polishing or physical polishing, and at this time, the second outer circuit pattern is lifted due to the non-uniformity of the polishing process.

Alternatively, the embodiment implements the second outer circuit pattern as a protrusion pattern and a buried pattern, respectively. That is, when the second outer circuit pattern is disposed on the upper surface of the insulating layer, a part of the second outer circuit pattern has a structure buried in an upper portion of the insulating layer. In addition, the remaining part of the second outer circuit pattern has a structure that protrudes on the upper surface of the insulating layer. In this case, the second outer circuit pattern includes a signal pattern for transmitting and receiving data signals and a ground pattern for power transmission or noise cancellation. The ground pattern has a line width greater than 15 μm, and thus has relatively strong characteristics against external impact. However, the signal pattern is formed to have a line width of at least 10 μm or less, thereby having a weak characteristic against external impact.

Accordingly, the embodiment functionally divides the second outer circuit pattern, so that the signal pattern has a structure buried in the insulating layer. In addition, the ground pattern of the second outer circuit pattern in the embodiment has a structure that protrudes on the upper surface of the insulating layer.

According to the embodiment, the signal pattern having a relatively small line width is disposed to be buried in the upper portion of the insulating layer, so that reliability problems such as collapse of the signal pattern due to an external impact can be solved.

In addition, the embodiment can minimize an interference between the signal pattern and the ground pattern by implementing the signal pattern and the ground pattern as a buried pattern and a protrusion pattern, respectively, and thus data transmission reliability can be improved.

In addition, the circuit board in the embodiment can be applied to the 5G communication system, thereby minimizing the transmission loss of the high frequency can further improve the reliability. Specifically, the circuit board in the embodiment can be used at a high frequency and can reduce propagation loss.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

What is claimed is:

1. A circuit board comprising:
   a first insulating layer;
   a second insulating layer disposed on the first insulating layer;
   a first via electrode passing through a partial region of the second insulating layer from an upper surface of the second insulating layer toward a lower surface of the second insulating layer; and
   a first outer circuit pattern including a first pattern buried in an upper region of the second insulating layer adjacent to the upper surface of the second insulating layer and a second pattern protruded on the second insulating layer; and
   wherein the first via electrode has a slope in which a width gradually decreases toward the first insulating layer;
   wherein the first pattern overlaps with a slope of a portion having a largest width in the first via electrode while being spaced apart from the first via electrode in a horizontal direction and has a thickness smaller than a thickness of the first via electrode, and wherein the second pattern does not overlap the first via electrode and the first pattern in the horizontal direction.

2. The circuit board of claim 1, wherein the second pattern includes:
a first pad overlapping the first via electrode in a vertical direction; and
a first trace overlapping the first pad in a horizontal direction without overlapping the first via electrode in a vertical direction;
wherein a width of the first trace in a horizontal direction is smaller than a width of the first pad in a horizontal direction; and
wherein the first pattern does not vertically overlap the first pad and the first trace of the second pattern.

3. The circuit board of claim 2, further comprising:
a first protective layer disposed on the second insulating layer;
wherein the first protective layer includes:
a first opening overlapping the first pad in a vertical direction; and
a second opening overlapping the first trace in a vertical direction.

4. The circuit board of claim 3, wherein a width of the first opening of the first protective layer in a horizontal direction is smaller than a width of the first pad in a horizontal direction, and
wherein at least a portion of an upper surface of the first pad is covered with the first protective layer.

5. The circuit board of claim 3, wherein a width of the second opening of the first protective layer in a horizontal direction is greater than a width of the first trace in a horizontal direction; and
wherein an upper surface and a side surface of the first trace do not contact the first protective layer.

6. The circuit board of claim 5, wherein the first trace includes a plurality of trace patterns spaced apart in a horizontal direction, and
wherein the second opening of the first protective layer commonly overlaps with at least two trace patterns in a vertical direction.

7. The circuit board of claim 3, wherein an upper surface of the first pattern is covered with the first protective layer.

8. The circuit board of claim 2, wherein a width of the first trace in a horizontal direction is greater than a width of the first pattern in a horizontal direction.

9. The circuit board of claim 8, wherein the first trace is connected to the first pattern through the first via electrode; and
wherein the first trace includes a ground pattern.

10. The circuit board of claim 1, further comprising:
a second via electrode passing through a partial region of the first insulating layer from a lower surface of the first insulating layer toward an upper surface of the first insulating layer; and
a second outer layer circuit pattern buried in a lower region of the first insulating layer.

11. The circuit board of claim 10, wherein the second outer layer circuit pattern includes:
a second pad overlapping the second via electrode in a vertical direction; and
a second trace overlapping the second pad in a horizontal direction without overlapping the second via electrode in a vertical direction; and
wherein a width of the second pad in a horizontal direction is greater than a width of the second trace in a horizontal direction.

12. The circuit board of claim 11, wherein the second via electrode has a slope in which a width gradually decreases toward the second insulating layer, and
wherein the second pad is in contact with a lower surface of the second via electrode.

13. The circuit board of claim 11, further comprising:
a second protective layer disposed under the first insulating layer and including at least one third opening.

14. The circuit board of claim 13, wherein a width of the third opening of the second protective layer in a horizontal direction is greater than a width of the second trace in a horizontal direction.

15. The circuit board of claim 14, wherein the second traces includes a plurality of second trace patterns spaced apart in a horizontal direction, and
wherein the third opening overlaps with a second trace pattern of at least one of the plurality of second trace patterns in a vertical direction;
wherein a pad layer is disposed under a second trace vertically overlapping with the third opening.

16. The circuit board of claim 15, wherein the second trace includes first to third trace patterns disposed adjacent to each other in a horizontal direction,
wherein the third opening overlaps the second trace pattern in a vertical direction; and
wherein lower surfaces of the first and third trace patterns are covered with the second protective layer.

17. The circuit board of claim 15, wherein a width of the pad layer in a horizontal direction is greater than a width of the second trace in a horizontal direction.

18. The circuit board of claim 17, wherein a width of the pad layer in a horizontal direction is 150% or more of a width of the second trace in a horizontal direction.

19. The circuit board of claim 16, wherein a width of the third opening in a horizontal direction is greater than a width of the pad layer in a horizontal direction, and
wherein a side surface and a lower surface of the pad layer do not contact the second protective layer.

20. A circuit board comprising:
an outer insulating layer including an upper surface and a lower surface;
a first outer circuit pattern including a first pattern embedded in the upper surface of the outer insulating layer, a second pattern protruded on the upper surface of the outer insulating layer;
a first inner circuit pattern buried in the lower surface of the outer insulating layer; and
a first via electrode disposed between the second pattern of the first outer circuit pattern and the first inner circuit pattern, and
wherein the first pattern overlaps the first via electrode in a horizontal direction.

* * * * *